(12) United States Patent
Haris

(10) Patent No.: US 8,292,563 B2
(45) Date of Patent: Oct. 23, 2012

(54) NONPRODUCTIVE WAFER BUFFER MODULE FOR SUBSTRATE PROCESSING APPARATUS

(75) Inventor: Clinton M. Haris, Lunenburg, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 776 days.

(21) Appl. No.: 11/168,908

(22) Filed: Jun. 28, 2005

(65) Prior Publication Data
US 2006/0056952 A1 Mar. 16, 2006

Related U.S. Application Data

(60) Provisional application No. 60/583,497, filed on Jun. 28, 2004.

(51) Int. Cl.
*H01L 21/677* (2006.01)
(52) U.S. Cl. ........ 414/217; 414/805; 414/935; 414/939; 414/940
(58) Field of Classification Search .................. 414/217, 414/217.1, 277, 935, 939, 940, 805
See application file for complete search history.

(56) References Cited

U.S. PATENT DOCUMENTS

| | | | |
|---|---|---|---|
| 5,443,346 A | 8/1995 | Murata et al. | 414/222.13 |
| 5,975,825 A | 11/1999 | Blattner et al. | 414/217 |
| 6,042,623 A * | 3/2000 | Edwards | 29/25.01 |
| 6,079,927 A | 6/2000 | Muka | 414/217 |
| 6,168,002 B1 | 1/2001 | Takahashi et al. | 193/341.01 |
| 6,336,546 B1 | 1/2002 | Lorenz | 198/346.2 |
| 6,392,403 B1 | 5/2002 | Conboy et al. | 324/158.1 |
| 6,431,814 B1 * | 8/2002 | Christensen et al. | 702/81 |
| 6,440,261 B1 * | 8/2002 | Tepman et al. | 414/222.01 |
| 6,540,468 B1 | 4/2003 | Blattner et al. | 414/416.08 |
| 6,585,470 B2 * | 7/2003 | Van Der Meulen | 414/217 |
| 6,696,367 B1 * | 2/2004 | Aggarwal et al. | 438/758 |
| 6,726,429 B2 * | 4/2004 | Sackett et al. | 414/217 |
| 6,817,823 B2 * | 11/2004 | Fix et al. | 414/217 |
| 6,853,872 B2 * | 2/2005 | Nishihata et al. | 700/121 |
| 6,941,185 B2 * | 9/2005 | Nishihata et al. | 700/121 |
| 7,108,121 B2 * | 9/2006 | Fujimura et al. | 198/347.1 |
| 7,314,808 B2 * | 1/2008 | Yilmaz et al. | 438/424 |
| 2002/0192057 A1 | 12/2002 | Meulen | 414/217.1 |
| 2003/0082031 A1 | 5/2003 | Vatel et al. | 414/222.01 |
| 2004/0026694 A1 * | 2/2004 | Blattner et al. | 257/48 |
| 2004/0258505 A1 | 12/2004 | Wu | 414/217.1 |
| 2007/0274810 A1 * | 11/2007 | Holtkamp et al. | 414/217 |

FOREIGN PATENT DOCUMENTS

WO WO02/05320 1/2002

\* cited by examiner

*Primary Examiner* — Scott Lowe
(74) *Attorney, Agent, or Firm* — Perman & Green, LLP; Colin C. Durham

(57) ABSTRACT

A sorter for handling and sorting semiconductor wafers is provided. The sorter has a housing, a handling and transport device and at least one nonproduction wafer buffer module. The housing has at least one holding area for interfacing one or more semiconductor wafer carriers to the housing. The housing defines an access path along which semiconductor wafers are transported between the housing and the one or more semiconductor wafer carriers. The handling and transport device is connected to the housing for transporting semiconductor wafers along the access path. The at least one nonproduction wafer buffer module is connected to the housing. The at least one nonproduction wafer buffer module buffers nonproduction wafers sorted by the sorter to one or more semiconductor wafer carriers. The at least one nonproduction wafer buffer module is located so that nonproduction wafers are transported by the handling and transport device, when being sorted to one or more of the semiconductor wafer carriers, along a different path than the access path.

11 Claims, 3 Drawing Sheets

NONPRODUCTIVE WAFER BUFFER MODULE FOR SUBSTRATE PROCESSING APPARATUS

CROSS-REFERENCE TO RELATED APPLICATION(S)

This application claims the benefit of U.S. Provisional Application No. 60/583,497 filed Jun. 28, 2004 which is incorporated by reference herein in its entirety.

BACKGROUND OF THE INVENTION

1. Field of the Invention

The exemplary embodiments are related to a substrate processing apparatus, and in particular to substrate processing apparatus handling non-productive workpieces.

2. Brief Description of Related Developments

One of the uses of conventional sorters is in the introduction of non productive workpieces (NPW) such as wafers or other test flat panels into the processing system, such as for example, production lots, test, qualification or filler wafer lots. Generally, in conventional systems, test panels, such as NPWs are held in carriers located or stored away from the sorter and transported to and from the sorter when used.

U.S. Pat. No. 6,336,546 describes one example of a conventional conveying system configured to transport carriers, such as flat panel cassettes, or for example, Front Opening Unified Pods (FOUPs)) containing semiconductor wafers to a plurality of processing centers. In this example, the conveying system lines up a series of carriers that store and index wafers at the processing centers.

PCT Patent No. WO 02/03424 A1 describes an example of a conventional storage and buffer system for cassettes containing semiconductor wafers consisting of two adjacent conveyor lines along which the cassettes move. One conveyor line serves as a transport row for cassettes and another serves as a storage row for cassettes. The conveying system also includes a means for rotating the cassettes such that they can be moved from the transport conveying row to the storage conveying row and vice-versa.

As seen from the above examples, in conventional processing systems, carriers with non-productive test workpieces are stored away from the sorter and are brought to the sorter/processing tool along with empty or partially filled carriers to which the non-productive wafers are added. Storage of non-productive test wafers away from sorter increases the time used to sort the non-productive test wafers into a destination carrier, which limits the productivity of the conventional semiconductor processing center. Further, placement of transport carriers of NPW onto a holding station(s) of sorter/processing tool(s) displaces carriers of production workpieces from the holding station(s) of the sorter/processing tools.

SUMMARY OF THE EXEMPLARY EMBODIMENTS OF THE INVENTION

In accordance with an exemplary embodiment, a sorter for handling and sorting semiconductor wafers is provided. The sorter has a housing, a handling and transport device and at least one nonproduction wafer buffer module. The housing has at least one holding area for interfacing one or more semiconductor wafer carriers to the housing. The housing defines an access path along which semiconductor wafers are transported between the housing and the one or more semiconductor wafer carriers. The handling and transport device is connected to the housing for transporting semiconductor wafers along the access path. The at least one nonproduction wafer buffer module is connected to the housing. The at least one nonproduction wafer buffer module buffers nonproduction wafers sorted by the sorter to one or more semiconductor wafer carriers. The at least one nonproduction wafer buffer module is located so that nonproduction wafers are transported by the handling and transport device, when being sorted to one or more of the semiconductor wafer carriers, along a different path than the access path.

In accordance with another exemplary embodiment, a method of handling and storing semiconductor wafers in a sorter is provided. The method comprises providing the sorter with a housing having an integral nonproductive wafer buffer module. The method further comprises buffering the nonproductive wafers at the buffer module and sorting with the sorter wafers within a wafer carrier interfaced with the housing. The sorting comprises moving nonproductive wafers from the buffer module to the wafer carrier interfaced with the housing.

DETAILED DESCRIPTION OF THE EXEMPLARY EMBODIMENTS

Figure 1:
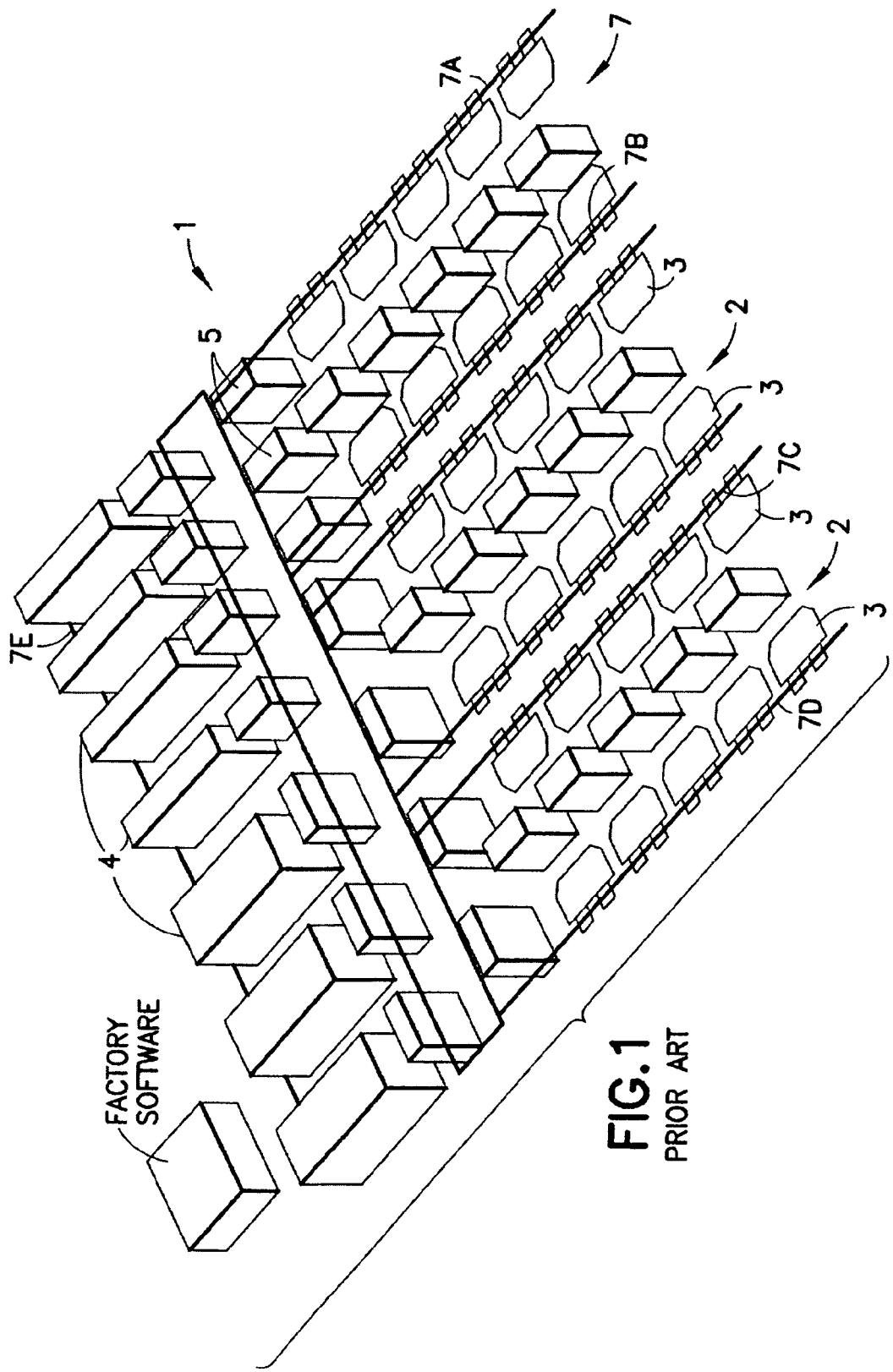
FIG. 1 is a schematic perspective view of a fabrication facility (FAB) in accordance with the prior art with fabrication/processing tools and a material handling system linking the fabrication/processing tools in the FAB.

Workpieces, such as for example semiconductor wafers in a fabrication facility (FAB) may be moved in and out of storage areas, such as stockers, and transport cassettes or carriers with automated handling devices or sorters. Semiconductor wafer cassettes or carriers, such as for example front opening universal pods (FOUPs) and carriers with standard mechanical interface (SMIFs), may serve for moving wafers around the semiconductor-processing facility (FAB). When a carrier is positioned at an environmental front-end module (EFEM) of a processing apparatus or tool for processing, or handling device may remove the cover of the carrier. The handling device then automatically picks-up wafers from the carrier and places them into other carriers, rearranges them within a given carrier, or places them into various processing stations or bays of the processing tools. An example of a conventional layout of a substrate processing facility (FAB) is illustrated in FIG. 1. The FAB has various processing apparatus/tools distributed therein and a material handling system linking the tools.

The processing tools in the FAB facility 1 may be arranged in any manner, and are shown in FIG. 1 arranged in processing bay in a general matrix arrangement. The FAB processing tools may be of any suitable kind and may include for example substrate processing tools 3, 4 (capable of carrying out any desired semiconductor substrate manufacturing process such as material deposition or layer growing processes, lithography and etching, diffusion, implantation, baking, cleaning, polishing), stockers 5 (for holding FAB transfer pods, substrate cassettes or substrates) Sorters (for sorting substrates according to desired process recipe in transfer pods or cassettes) may be provided as a dedicated and distinct processing tool (e.g. tool 4) or may be included as part of a mixed purpose processing tool. The processing facility may also have a FAB material handling system 7 for handling substrates, either in transfer carriers (such as FOUPs or SMIFs), cassettes or individually, between the various processing tools in the FAB 1. The handling system 7 may have intrabay sections 7A-7D connecting processing stations located in the FAB bays, and interbay sections 7E connecting the intrabay sections. The material handling system 7 may transport the wafers (individually or in batches as noted above) to various processing tools 3, 4, 5 according to a desired fabrication protocol. At each tool, the wafer(s) is accessed (from its transport carrier) by the tool handling device, as noted above, for processing at the various processing station(s) of the tool. After a wafer is processed, the handling device returns processed wafer(s) to set positions in the carriers for subsequent processing, handling or transport operations. As noted before, the processing tools may include sorters, provided as dedicated tools 4 or included in processing tools with other processing capabilities (e.g. semiconductor generation or formation processes noted before, or stockers or metrology tools.)

In any event, whether in dedicated or combined tools, semiconductor sorters may also be used for insertion of non-productive wafers and other test articles/workpieces, also referred to as test wafers into processing and transport operations including productions lots, test, qualification or filler wafer lots.

Figure 2:
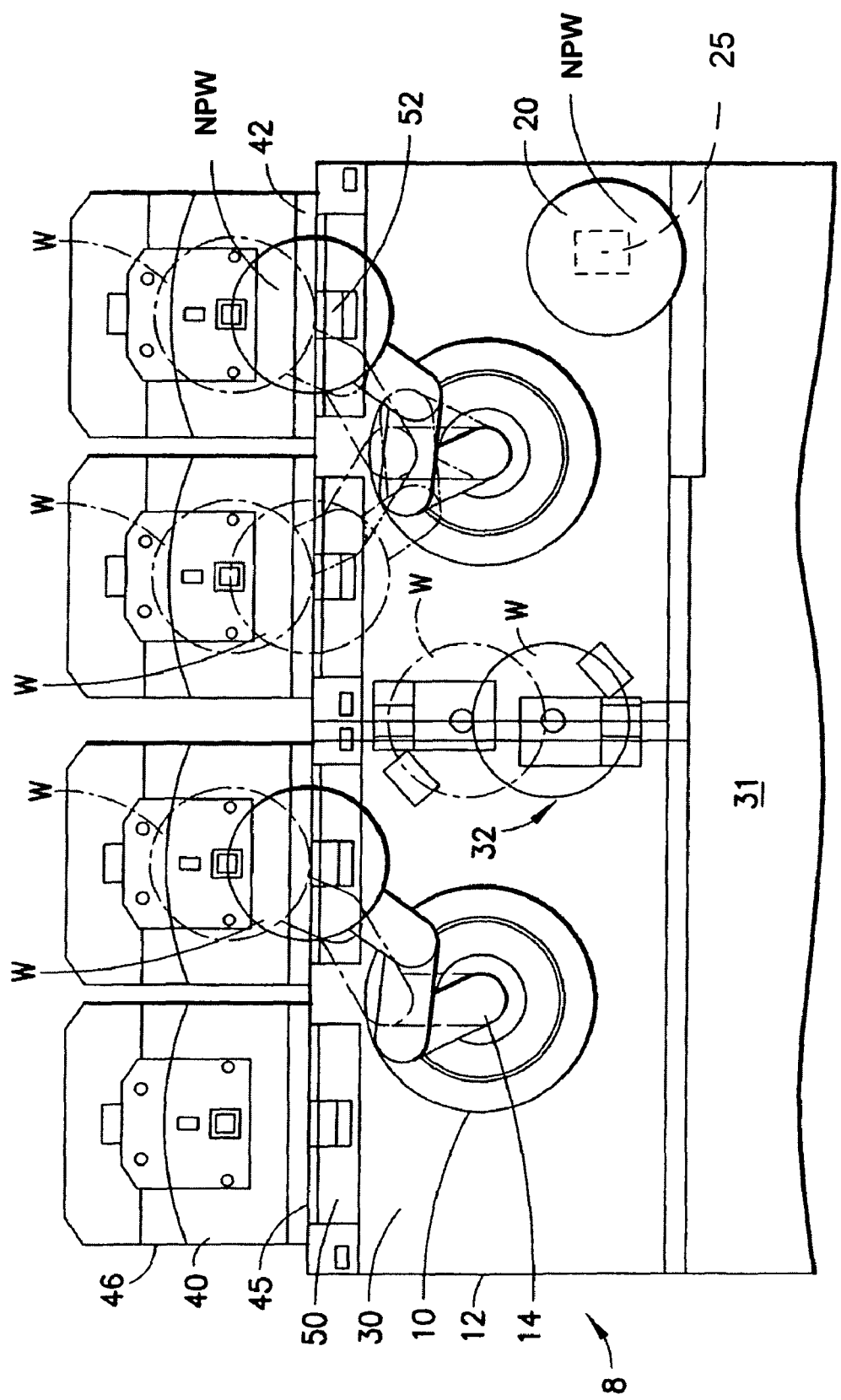
FIG. 2 is a schematic plan view of a processing apparatus incorporating features in accordance with an exemplary embodiment of the present invention.

FIG. 2 is a top plan view of a semiconductor processing apparatus 8 incorporating features in accordance with one exemplary embodiment. The apparatus 8 generally includes a semiconductor handling and sorting device 10 with a buffer module 20 located within the sorter. The semiconductor processing apparatus 8 is illustrated in FIG. 2 as a representative processing apparatus. The processing apparatus may be any desired processing tool, such as a semiconductor workpiece generation/formation tool (capable of carrying out any desired semiconductor formation process such as layer-growing process or material deposition, lithography and etching, cleaning, baking, polishing), stocker or metrology tool. The apparatus may also be a dedicated sorting tool as described before. In the exemplary embodiment shown, the apparatus 8 has a front section and a back section. The front section, in this embodiment, may be an environmental front end module (EFEM) 30. In this embodiment, the EFEM 30 includes the sorting device 10, as will be described in greater detail below. The back section 31 may include one or more processing stations (not shown), and if desired a workpiece transport system (not shown) for carrying out one or more processes noted above. One example of a suitable back section of the apparatus 8 is the GX tools from Brooks Automation, Inc. In alternate embodiments, the back section may be configured as a stocker capable of holding transport containers (FOUPs, SMIF(s)), workpiece cassettes, or individual workpieces. In other alternate embodiments, the back section may be configured to provide any other desired combination of processing. Also, it is noted that though the apparatus 8 has been and is described below with particular reference to processing semiconductor wafers for example 200 mm or 300 mm wafers. The features of the exemplary embodiment are equally applicable to processing apparatus handling reticles, pelicles, or flat panels (such as for flat panel displays) of any desired type. The back section 31 of the apparatus 8 may have an isolated atmosphere such as an inert gas or may be maintained in vacuum condition. Accordingly, the back section 31 may interface with EFEM 30 via one or more load locks (not shown). In general, the EFEM 30 may operate to interface the FAB facility (or for example the material handling system, in the FAB, similar to material handling system 7 in FIG. 1) to the back section of the apparatus. In this embodiment, as noted before the EFEM 30 also incorporates sorter 10.

Still referring to FIG. 2, the EFEM 30 generally has a housing 12, workpiece transport or handling apparatus/robot(s) 14 and a workpiece access system 45. The housing 12 may provide the EFEM 30 with a controlled atmosphere (with a limited particulate count) compared to the atmosphere exterior to the EFEM. Filters and other atmosphere control systems (e.g. airflow direction systems, fans, (not shown)) may be mounted to housing 12 to facilitate atmospheric control in the EFEM. The workpiece access system 45 may also be connected to housing 12 to assist in maintaining a controlled atmosphere inside the EFEM. For example, the workpiece access system 45 may include load port(s) or load port module(s) 50 (four (4) are shown in FIG. 2 for example purposes) mounted to housing 12. An example of a suitable load port module is disclosed in U.S. Pat. No. 5,772,386, issued Jun. 30, 1998; U.S. Pat. No. 6,071,059, issued Jun. 6, 2000; U.S. Pat. No. 6,375,403, issued Apr. 23, 2002; U.S. Pat. No. 6,461,094, issued Oct. 8, 2022; U.S. Pat. No. 6,609,876, issued Aug. 26, 2003; U.S. Pat. No. 6,837,663, issued Jan. 4, 2005, incorporated by reference herein in its entirety. Each load port(s) may have a workpiece transport opening that may be blocked or closed (at least in part) by a door 52. Each load port may also have a holding section 46 for holding transport carriers 40 and connecting or docking the carrier to the EFEM 30. The transport robots 14 (two (2) of which are shown in FIG. 2 for example purposes) are capable of reaching workpieces in the carrier(s) 40 seated on holding station(s) 46 of the load port module(s) 50. As may be realized, when the carrier(s) 40 is connected to the EFEM 30 (via the load port module(s), the closure 42 in the side of the carrier 40 (carrier 40 is shown as having a FOUP configuration for example purposes only) may be removed. For example, the carrier closure 42 may be removed in unison with opening of the load port door 52. This opens the access in the EFEM load port and the carrier so that workpieces W inside the carrier may be accessed by the transport robot M, and the transport robot may deposit workpieces into the carrier from various stations in the apparatus 8.

The transport robot(s) 14 (shown in FIG. 2 as a scara type arm, though in alternate embodiments it may be any other suitable transport device) may be controlled, by a suitable controller (not shown) for handling and sorting workpieces W stored in the carrier(s) 40 connected to the handling and sorting device through the use of the load ports 50. Thus, for example an environmental front end module 30, incorporates workpiece handling and sorting device 10 for handling and sorting workpieces in the carrier(s) 40.

In the exemplary embodiment shown in FIG. 2, the EFEM 30 has interior workpiece station(s) where one or more workpiece may be held. In this embodiment, EFEM 30 has aligner(s) 32 (two aligners are shown for example purposes, though in alternate embodiments there may be more, or fewer or no aligners in the EFEM). The EFEM may also have other workpiece stations (not shown) such as a metrology station(s). As seen in FIG. 2, the aligner(s) 32 and other workpiece stations in the EFEM are located within the reach of the transport robot(s) 14. Accordingly, the transport robot(s) 14, shown in a number of different positions in FIG. 2, may transport workpieces W, NPW between the carrier(s) (on the load port(s) 50) the EFEM workpiece station(s) 32 and the interface with the back section 31 of apparatus 8.

Also contained within the sorter—EFEM module 30, as shown in FIG. 2, may be one or more buffer modules 20, also referred to as holding modules, for storing workpiece(s). Non-productive workpiece(s) NPW may be stored within the buffer module 20. The non-productive workpieces NPW may be of any suitable type, such as test wafers used in the testing and qualification of various processing parameters of the apparatus 8. The buffer module 20 has a support mechanism 25 contained within it for properly supporting workpiece(s) NPW. Support mechanisms may be one or more vertical arrayed support(s), horizontal arrayed support(s), point array(s) and other type of suitable structure forming support matrix for holding one or more flat panel(s), such as test wafers, in a desired vertical/horizontal buffer arrangement.

In FIG. 2, the buffer module 20 is located for example purposes, proximate to the robotic transport 14 of the semiconductor handling and sorting device 10 so that the one or more buffer station(s) or module 20 are accessible by transport 14. Accordingly, transport robot(s) 14 may transport non-productive workpiece(s) NPW between buffer module 20 and any of the carrier(s) 20 on any load port 50, as well as any other workpiece station in the EFEM 30. In alternate embodiments one or more buffer modules 20 may be located in any suitable location in the housing of EFEM 30, such as on the semiconductor handling and sorting device 10 or on the transport robot 14 of the handling and sorting device 10. Further, any desired number of buffer modules may be located in the module housing though only one is shown in FIG. 2 for example purposes. As seen in FIG. 2, at least part of the EFEM housing 12 houses or encloses the buffer module 20. In the example shown, a portion of the outer walls of the housing 12, may be used for and define the buffer module 20. Thus, in the example shown in FIG. 2, the buffer module 20 is integral to the EFEM 30 sorting device to, and is included within the EFEM housing itself. As may be realized, the buffer module 20 may be capable of holding any desired type of workpiece(s) including both nonproductive workpiece(s) NPW and production workpiece(s) W. For example, the buffer module 20 may initially hold nonproductive workpiece NPW (that may be introduced into the buffer module 20 using robot transport 14 from a carrier (similar to carrier 40) holding nonproductive workpieces). A carrier 40 with production workpiece(s) W may be connected (via load port 50) to apparatus 8 for sorting with sorter 10 as described before. According to a desired fabrication protocol in the controller (not shown) carrier 40, and in particular the production workpiece(s) W held therein, may be scheduled to proceed from the sorter 10 to another processing tool that may be subject to test or some qualification prior to commencement of processing of production workpiece(s). Accordingly, it is desired to introduce one or more nonproductive workpieces NPW into carrier 40 with the sorter 10. It is noted, that the carrier 40 may be filled, partially filled, or empty with production workpiece(s) W when brought to the apparatus 8. In the event carrier 40 is initially/or prior to placement of non-productive workpiece(s) NPW therein) filled with production workpiece(s) W, the robot transport 14 may remove a desired number of workpiece(s) W from the carrier, and place them in buffer stations of buffer module 20. With spaces available in the carrier, the desired nonproductive workpiece(s) are transported from buffer module 20 and placed in carrier 40 with robot 14. After processing, the carrier 40 may be returned to sorter 10 to remove the nonproductive workpieces(s) NPW, which may be restored to buffer module 20.

Figure 3:
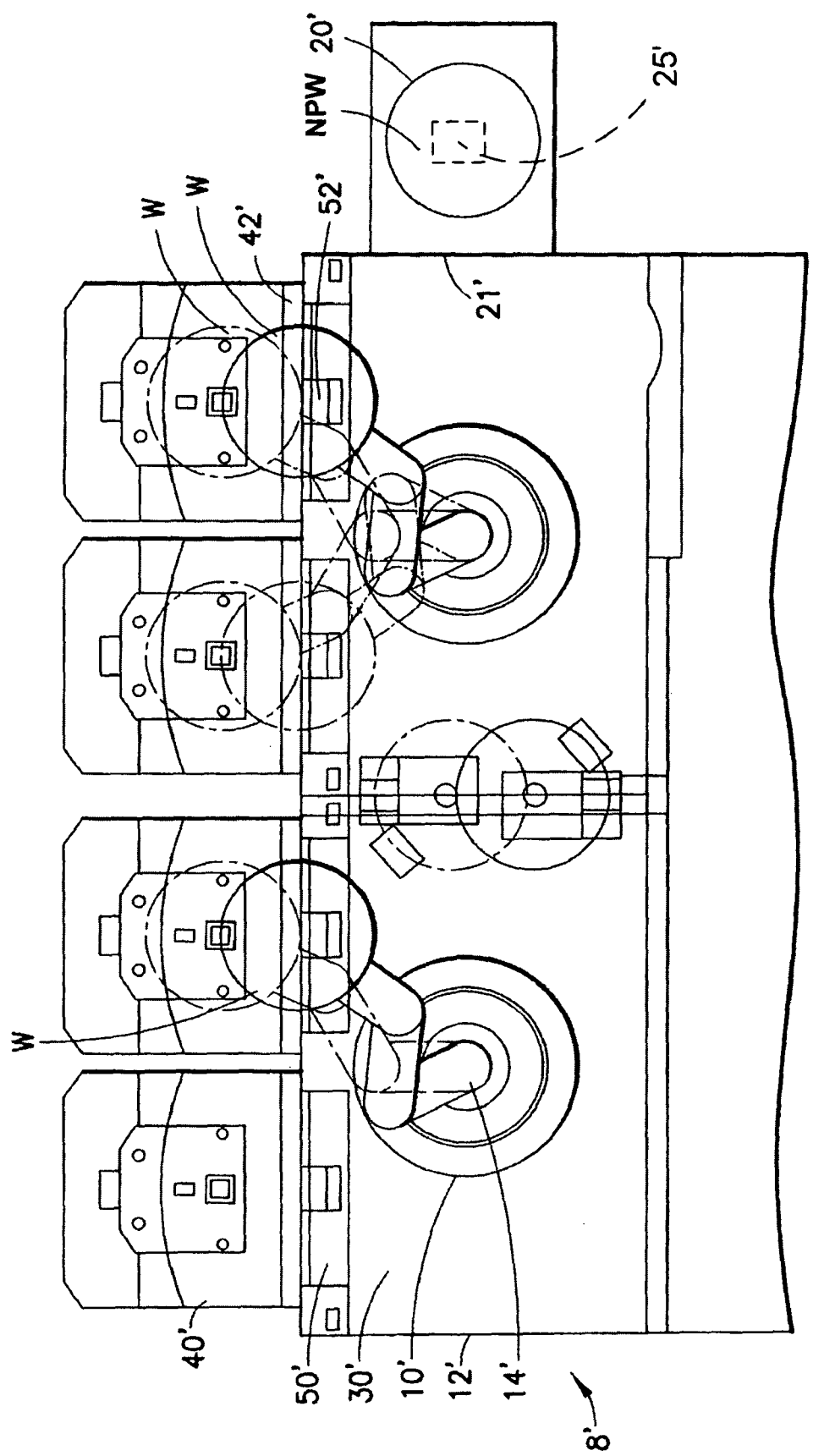
FIG. 3 is a schematic plan view of another processing apparatus in accordance with another exemplary embodiment.

FIG. 3 is a top perspective drawing of a semiconductor handling and sorting device 10' with a buffer module 20' located exterior to the sorter—EFEM module 30 in accordance with a second exemplary embodiment.

The apparatus 8' in FIG. 3 with semiconductor handling and sorting device 10' is generally similar to apparatus 8 with sorting device 10 described before and shown in FIG. 2. Similar features are similarly numbered. Apparatus 8 has a housing 12' within which is located one or more robotic transport(s) 14' for handling and sorting workpieces stored in carriers 40'. The carriers 40' connect to the handling and sorting device 10' through the use of the loadports 50', of the environmental front end module 30', containing one or more air interlocked openings 52' for coupling to the door side of the carrier 42'. In this exemplary embodiment, located exterior to the sorter—EFEM module 30' are one or more buffer modules 20' for storing workpieces (only one is shown in FIG. 2 for example purposes). Non-productive workpieces NPW, such as test wafers, may be stored within the buffer module 20'. The buffer module 20' has a support mechanism 25' contained within it for properly supporting the workpieces. Support mechanisms are vertical supports, horizontal supports, point arrays and other type of suitable workpiece support structure. As seen in FIG. 3, the housing 12' of the apparatus 8' may have an opening 21' for communicating with the buffer module 20'. The buffer module 20' may be removably mounted to the exterior of the sorter housing, or may be integrated into the sorter housing. The buffer module 20' may be provided with a closable door (not shown) to isolate the buffer module 20' from the interior of the sorter 10'. The workpiece(s), whether nonproductive workpiece(s) NPW, or production workpiece(s) W, buffered in buffer module 20' are accessible by transport robots 14', through opening 21' in the housing 12', and may be transported by the robot(s) 14' in a manner similar to that described before with respect to apparatus 8/sorter 10 and FIG. 2.

Placement of one or more buffer modules 20' either within or just exterior to the sorter—EFEM module 30' permits workpieces to be located in close proximity to their point of handling for subsequent sorting or processing by one or more robotic type devices 14. As may be realized from FIG. 3, nonproductive workpieces NPW, or other objects, stored in the buffer module may be loaded into cassettes 40' with robot 14'. Furthermore, buffer modules 20' are not limited to storing non-productive workpieces, but may store productive workpiece types sorted or otherwise handled by the handling and sorting device 10'. Alternatively, the buffer module 20' may serve as a storage location for unprocessed workpieces, and also as a temporary holding area for defective workpieces (for example identified by a metrology tool), and fully processed workpieces awaiting removal from the sorter—EFEM module 30'. The buffer module 20' may also serve as a work-in-process storage location for workpieces being processed. When more than one buffer modules 20' are utilized within or just exterior to the EFEM module 30', each buffer module 20' may be designated for a specific type of function depending upon the workpiece type stored (non-productive test, defective, unprocessed, work-in-process, fully processed, etc.). Buffer modules 20' may be maintained at the same level of cleanliness as the sorter—EFEM module 30'. In alternate embodiments, the buffer module may have a different environment than the sorter.

The handling and sorting device 10, 10' may perform a variety of operations utilizing the buffer module 20, 20'. Among the operations are the following: moving workpieces between locations within a buffer module, moving workpieces between buffer modules, moving workpieces between buffer modules and carriers, moving workpieces between buffer modules and processing bays or centers, moving workpieces within and between carriers. All these operations may be carried out with the robot transport 14, 14' described above.

Having the buffer modules 20, 20' integrated into the sorter 10, 10' decreases the time used for workpiece material handling and transport which ultimately improves the productivity of the sorter—EFEM module 30.

A typical sequence of steps carried out by the semiconductor handling and sorting device 10, 10' in transporting semiconductor wafers includes storing non-productive workpiece(s) NPW at buffer module 20, 20' (located within or just exterior to the sorter-EFM module 30, 30'); moving one or more non-productive workpiece(s) NPW from the buffer module 20, 20' to a desired carrier 40, 40' (connected to apparatus 8, 8') and sorting non-productive workpiece(s) NPW within the carrier 40, 40'. Additional steps utilizing the above described workpiece types, and handling and storing operations with the use of one or more buffer modules 20' may be added to achieve alternative methods and sequences.

The exemplary embodiments of the present invention provide a device and method for alleviating the problems of conventional systems that store non-productive workpieces away from the handling and sorting device. The exemplary embodiments described above decreases the processing time used for handling, and sorting workpieces in the FAB.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A semiconductor wafer sorter for handling and sorting semiconductor wafers and originating a predetermined sort order of semiconductor wafers in one or more semiconductor wafer carriers, the semiconductor wafer sorter comprising:
    a housing with at least one load port module for interfacing the one or more semiconductor wafer carriers to the housing,
    an access path defined by the housing and extending through a closable opening of the at least one load port module disposed between the housing and the one or more semiconductor wafer carriers along which semiconductor wafers are transported from the one or more semiconductor wafer carriers having an initial sort, through the housing and into the one or more semiconductor wafer carriers resorting the semiconductor wafers within the one or more semiconductor wafer carriers from the initial sort and originating the predetermined sort order of semiconductor wafers in the one or more semiconductor carriers disposed on the at least one load port module,
    a handling and transport device connected to the housing for transporting semiconductor wafers along the access path, and
    at least one non-production wafer buffer module connected to the housing, the at least one non-production wafer buffer module buffering non-production wafers introduced by the sorter to the one or more semiconductor wafer carriers when originating the predetermined sort order of semiconductor wafers in the one or more semiconductor wafer carriers,
    a second path extending through the closable opening between the non-production buffer module and the one or more semiconductor wafer carriers,
    a controller configured to control the handling and transport device for effecting introduction of non-production wafers to the one or more semiconductor wafer carriers along the second path and the origination of the predetermined sort order of semiconductor wafers in the one or more semiconductor wafer carriers along the access path, and
    wherein the at least one nonproduction wafer buffer module is located so that non-production wafers are transported by the handling and transport device, when being sorted to the one or more semiconductor wafer carriers, along the second path between the non-production buffer module and the one or more semiconductor wafer carriers, the second path being different than the access path and having an end point that is independent of the access path.

2. The sorter according to claim 1, wherein the housing forms an environmental front end module.

3. The sorter according to claim 1, wherein the handling and transport device has a scara arm.

4. The sorter according to claim 1, wherein the at least one non-production wafer buffer module is included in the housing.

5. The sorter according to claim 1, wherein the at least one non-production wafer buffer module is mounted to the exterior of the housing.

6. The sorter according to claim 1, wherein the at least one non-production wafer buffer module communicates with an interior of the housing through a closable opening.

7. The sorter according to claim 1, wherein the nonproduction wafers are test wafers.

8. A semiconductor wafer processing tool comprising the sorter according to claim 1.

9. The sorter according to claim 1, wherein the at least one nonproduction wafer buffer module comprises either vertical supports, horizontal supports, or point arrays.

10. A method of handling and sorting semiconductor wafers and originating a predetermined sort order of semiconductor wafers in one or more wafer carriers with a sorter comprising:
    providing the sorter with
        a housing having an integral non-productive wafer buffer module and at least one load port module,
        an access path defined by the housing and extending through a closable opening of the at least one load port module disposed between the housing and the one or more wafer carriers located on the at least one load port module, the access path being arranged for transporting the semiconductor wafers from one or more wafer carriers having an initial sort, through the housing and into the one or more semiconductor wafer carriers resorting the semiconductor wafers within the one or more semiconductor wafer carriers from the initial sort and originating the predetermined sort order of semiconductor wafers in the one or more semiconductor carriers disposed on the at least one load port module,
        a second path extending through the closable opening between the non-productive wafer buffer module and the one or more wafer carriers, and
        a controller configured to control the sorter for transferring wafers between the housing and the one or more wafer carriers along the access path and transferring non-productive wafers between the non-productive wafer buffer module and the one or more wafer carriers along the second path;

buffering non-productive wafers introduced by the sorter to the one or more wafer carriers at the buffer module when originating the predetermined sort order of semiconductor wafers in one or more wafer carriers;

sorting with the sorter, under the control of the controller, wafers within a wafer carrier interfaced with the housing at the at least one load port module of the housing and along the access path, wherein sorting comprises, moving non-productive wafers from the buffer module to the wafer carrier interfaced with the housing along a second path between the non-production buffer module and the one or more semiconductor wafer carriers, the second path being different than the access path and having an end point that is independent of the access path.

11. The method of claim 10, further comprising providing the non-productive wafers from a source that is different than the wafer carrier.

* * * * *

UNITED STATES PATENT AND TRADEMARK OFFICE
CERTIFICATE OF CORRECTION

| | | |
|---|---|---|
| PATENT NO. | : 8,292,563 B2 | Page 1 of 1 |
| APPLICATION NO. | : 11/168908 | |
| DATED | : October 23, 2012 | |
| INVENTOR(S) | : Haris | |

It is certified that error appears in the above-identified patent and that said Letters Patent is hereby corrected as shown below:

In the Claims:

Column 8, claim 10, line 50, delete "from one" and insert --from the one-- therefor.

Signed and Sealed this
Fourth Day of June, 2013

Teresa Stanek Rea
*Acting Director of the United States Patent and Trademark Office*